(12) United States Patent
Zubia et al.

(10) Patent No.: US 8,518,737 B2
(45) Date of Patent: Aug. 27, 2013

(54) METHODS AND APPARATUS FOR REAL-TIME MONITORING OF CADMIUM ION DURING SOLUTION GROWTH OF CADMIUM SULFIDE THIN FILMS

(75) Inventors: David Zubia, El Paso, TX (US); Rafael Ordonez, Tuscon, AZ (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 13/222,710

(22) Filed: Aug. 31, 2011

(65) Prior Publication Data
US 2012/0058596 A1    Mar. 8, 2012

Related U.S. Application Data

(60) Provisional application No. 61/379,862, filed on Sep. 3, 2010.

(51) Int. Cl.
*H01L 31/18* (2006.01)
(52) U.S. Cl.
USPC .................................. 438/95; 257/E31.015

(58) Field of Classification Search
USPC .................... 438/57, 95, 478, 492, 497, 500; 257/E31.015
See application file for complete search history.

(56) References Cited

U.S. PATENT DOCUMENTS

| | | | |
|---|---|---|---|
| 5,624,846 A * | 4/1997 | Hayashibe et al. | 436/50 |
| 6,537,845 B1 * | 3/2003 | McCandless et al. | 438/93 |
| 7,541,067 B2 * | 6/2009 | Basol | 427/430.1 |
| 2011/0155207 A1 * | 6/2011 | Singh | 136/244 |

* cited by examiner

*Primary Examiner* — Savitr Mulpuri
(74) *Attorney, Agent, or Firm* — Chainey P. Singleton; Edwin S. Flores; Chalker Flores, LLP

(57) ABSTRACT

The present invention provides a reaction chamber to monitor a metal ion in solution during the formation of a metal-sulfide layer on a substrate. The reaction chamber houses a solution of an ammonium ion, a metal ion and a buffer. The reaction chamber includes an anion-selective electrode in the solution to monitor the metal ion that measures the metal ion during metal-ammonium complex formation, metal-thiourea complex formation, metal sulfide composition formation, metal sulfide layer formation or a combination thereof.

15 Claims, 3 Drawing Sheets

METHODS AND APPARATUS FOR REAL-TIME MONITORING OF CADMIUM ION DURING SOLUTION GROWTH OF CADMIUM SULFIDE THIN FILMS

CROSS-REFERENCE TO RELATED APPLICATIONS

This application claims priority to U.S. Provisional Application Ser. No. 61/379,862, filed Sep. 3, 2010, the contents of which is incorporated by reference herein in its entirety.

TECHNICAL FIELD OF THE INVENTION

The present invention relates in general to the field of semiconductor compositions, specifically to compositions of matter and methods of making and using semiconductor compositions formed by real-time monitoring of cadmium ion during solution growth of cadmium sulfide thin films.

STATEMENT OF FEDERALLY FUNDED RESEARCH

None.

INCORPORATION-BY-REFERENCE OF MATERIALS FILED ON COMPACT DISC

None.

BACKGROUND OF THE INVENTION

Without limiting the scope of the invention, its background is described in connection with cadmium sulfide layers and cadmium sulfide film formation reactions.

Efficient photovoltaic devices, such as solar cells, have been fabricated using absorber layers made with alloys containing elements of group IB, IIIA and VIA, e.g., alloys of copper with indium and/or gallium or aluminum and selenium and/or sulfur. One common combination of the aforementioned elements is copper-indium-gallium-diselenide (CIGS) and the resulting devices are often referred to as CIGS solar cells. The CIGS absorber layer may be deposited on a substrate.

Typical deposition techniques include evaporation, sputtering, chemical vapor deposition, and the like. These deposition processes are typically carried out at high temperatures and for extended times. Both factors can result in damage to the substrate upon which deposition is occurring. Such damage can arise directly from changes in the substrate material upon exposure to heat, and/or from undesirable chemical reactions driven by the heat of the deposition process. Thus, very robust substrate materials are typically required for fabrication of CIGS solar cells.

In CdTe and CIGS solar cells, cadmium sulfide works as a window layer that does not absorb much light, however, its thickness optimization is important to make high efficiency solar cells. Although solution growth of cadmium sulfide thin films has been implemented for many years for its simplicity and cost, it is a challenge currently in the art to control the thickness and density of the films because of the reaction complexity.

Generally, cadmium sulfide films are grown using cadmium complexing agents such as ammonium hydroxide, amines, and acetates; however, measuring cadmium concentration changes in these cadmium complexing compositions is impossible since the buffer cadmium concentration and cadmium ion concentration is below the detectable limit of the electrode.

BRIEF SUMMARY OF THE INVENTION

The present invention uses an anion-selective electrode to monitor changes of cadmium ion in solution while cadmium sulfide is being grown as thin films.

The present invention provides a modification of complexing agents in cadmium sulfide layer formation that allows cadmium ion molarity to be monitored in real time for the first time. The present invention provides a growth process of slow titration of a sulfide precursor to the solution containing cadmium ions and complexes under slightly basic conditions. Real-time cadmium concentration monitoring is used to identify when cadmium sulfide film heterogeneously grows and cadmium sulfide powder homogenously precipitates. The real-time monitoring of cadium ion concentration of the present invention allows for the first-time, Real-Time Control and suppression of homogeneous precipitation of CdS during heterogeneous nucleation and ion-by-ion growth of dense CdS film.

The present invention provides a reaction chamber to monitor a metal ion in solution during the formation of a metal-sulfide layer on a substrate. The reaction chamber houses a solution of an ammonium ion, a metal ion and a buffer. The reaction chamber includes an anion-selective electrode in the solution to monitor the metal ion that measures the metal ion during metal-ammonium complex formation, metal-thiourea complex formation, metal sulfide composition formation, metal sulfide layer formation or a combination thereof.

The present invention also provides a method for forming a metal layer on a solar cell substrate by providing a reaction chamber in communication with a solution and combining an ammonium ion, a metal ion, and a buffer in the solution. The metal ion in the solution is monitored at one or more steps with an anion-selective electrode. A metal-ammonium complex is formed in the reaction chamber and then decomplexed. The solution is titrated with a thiourea composition to form a metal-thiourea complex and a metal sulfide composition formed from the metal-thiourea complex and deposited as a metal sulfide layer on a solar cell substrate.

The present invention discloses a method of forming a metal sulfide layer by providing a reaction chamber in communication with a solution; providing a substrate in communication with the reaction chamber and the solution; combining an ammonium ion, a metal ion, and a buffer in the solution; monitoring the metal ion in the solution with an anion-selective electrode; forming a metal-ammonium complex in the reaction chamber, decomplexing the metal-ammonium complex; titrating with a thiourea composition to form a metal-thiourea complex; forming a metal sulfide composition from the metal-thiourea complex; and depositing a metal sulfide layer on a solar cell substrate in the reaction chamber.

The present invention also discloses a method to identify cadmium sulfide film heterogeneously growth and cadmium sulfide powder homogenous precipitates by providing a reaction chamber in communication with a solution; providing a substrate in communication with the reaction chamber and the solution; combining an ammonium ion, a cadmium ion, and a buffer in the solution; monitoring the cadmium ion in the solution with an anion-selective electrode to identify a heterogeneous cadmium sulfide film growth or a homogenous cadmium sulfide powder precipitate; forming a cadmium-ammonium complex in the reaction chamber, decomplexing the cadmium-ammonium complex; titrating with a thiourea composition to form a cadmium-thiourea complex; forming a metal sulfide composition from the cadmium-thiourea complex; and depositing a cadmium sulfide layer on a solar cell substrate in the reaction chamber.

The present invention includes a method of monitoring cadmium sulfide layer deposition on a substrate by providing a reaction chamber in communication with a solution; providing a substrate in communication with the reaction chamber and the solution; combining an ammonium ion, a cadmium ion, and a buffer in the solution; monitoring the cadmium ion in the solution with an anion-selective electrode; forming a cadmium-ammonium complex in the reaction chamber, decomplexing the cadmium-ammonium complex; titrating with a thiourea composition to form a cadmium-thiourea complex; forming a cadmium sulfide composition from the cadmium-thiourea complex; and depositing a cadmium sulfide layer on a solar cell substrate in the reaction chamber.

The present invention includes a method of fabricating a semiconductor composition by providing a reaction chamber in communication with a solution; providing a substrate in communication with the reaction chamber and the solution; combining an ammonium ion, a metal ion, and a buffer in the solution; monitoring the metal ion in the solution with an anion-selective electrode; forming a metal-ammonium complex in the reaction chamber, decomplexing the metal-ammonium complex; titrating with a thiourea composition to form a metal-thiourea complex; forming a metal sulfide composition from the metal-thiourea complex; and depositing a metal sulfide layer on a solar cell substrate in the reaction chamber.

BRIEF DESCRIPTION OF THE SEVERAL VIEWS OF THE DRAWINGS

For a more complete understanding of the features and advantages of the present invention, reference is now made to the detailed description of the invention along with the accompanying figures and in which.

DETAILED DESCRIPTION OF THE INVENTION

Figure 1:
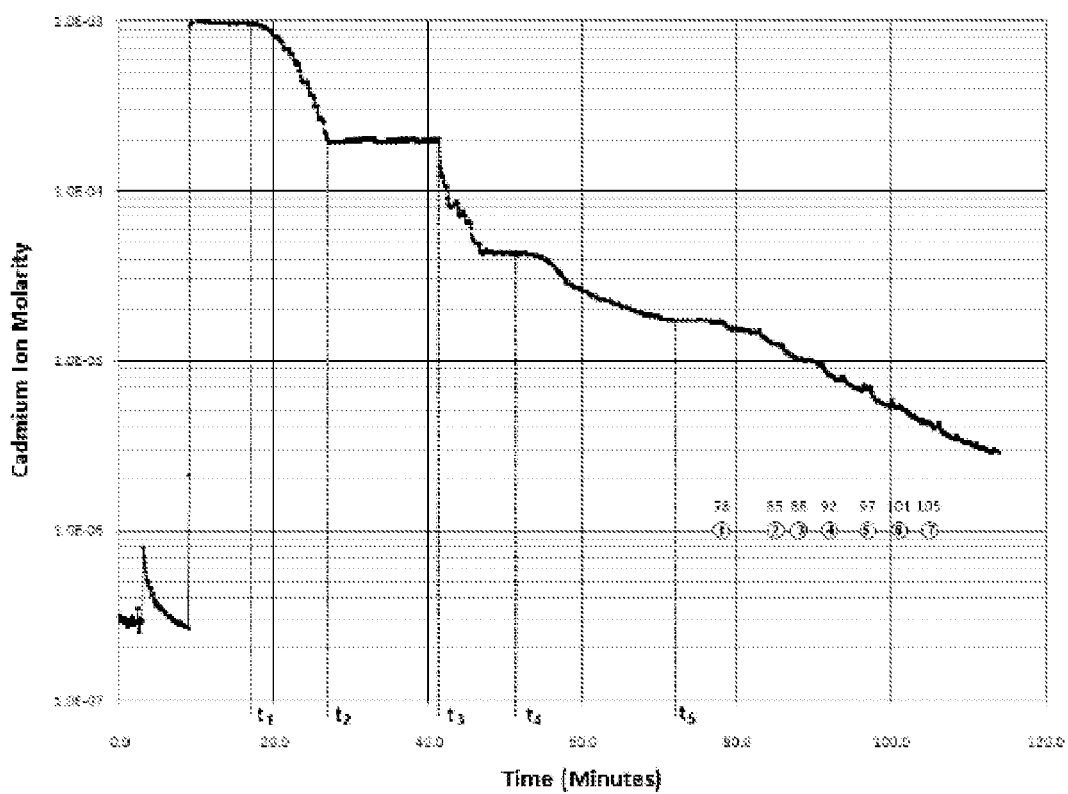
FIG. 1 is a graph of the real time monitoring of cadmium ion molarity with pH=8.4 and slowly titrated thiourea molarity of 2.5 mM.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

As used herein, the term "slightly basic" "weak base" or "basic" is used to denote a chemical compound that, when dissolved in water, gives a solution with a hydrogen ion activity lower than that of pure water, i.e., a pH higher than 7.0 at standard conditions. The modifier slightly can be used to refer to pH ranges from 7 to 10 and include all numbers in between in both ranges (e.g., 7.001 to 8.3, 7.2-9.07 and 8.4-9.997) and individual pH values (e.g., 7.001, 8.3, 7.29, 8.6, 9.07, 9.997 and all incremental numeric variations thereof. The term "slightly basic," "weak base," or "basic" can be defined in terms of Brønsted-Lowry, Arrhenius, and/or Lewis acid-base theory.

Cadmium sulfide is a direct band gap semiconductor material used as a thin film layer in solar cells since 1955. Thin films of cadmium sulfide have also been used since 1964 in other electronic devices such as light sensors gas sensors, light emitting diodes, and transistors. Besides being considered for research by the scientific community, cadmium sulfide thin films are very important for companies that manufacture solar cells of cadmium telluride (CdTe), copper indium diselenide ($CuInSe_2$ or CIS), and copper indium gallium diselenide (CIGS).

Controlling the production processes of cadmium sulfide thin films is very important to the solar cell industry. The most common methods for producing cadmium sulfide thin films are Chemical-Bath-Deposition (CBD), Chemical-Vapor-Deposition (CVD), Spray-Pyrolysis (SP), and sputtering. Among these methods, CBD is known for being the most inexpensive as well as the most mysterious due to lack of real-time monitoring and control of nucleation and crystal growth. The CBD method for cadmium sulfide was introduced in 1965 by Kitaev et al. after finding the parameters that allow cadmium sulfide to grow in an aqueous solution as a thin film. Since then, many different groups have tried to understand and therefore control CBD CdS reaction kinetics using only post deposition film characterization and analysis of theoretical equilibrium reactions. The lack of real-time monitoring prevented detailed studies of reaction kinetics and control of the process.

Finally, in 1992, Lincon and Ortega-Borges used a quartz crystal microbalance (QCM) in-situ sensor to analyze mass exchange at the solution-substrate interface and reaction kinetics. In 2004, Voss et al. used a QCM and theoretical equilibrium reaction of CBD CdS to more accurately explain reaction kinetics. Voss et al. concluded that free cadmium ions ($Cd^{2+}$) are consumed in solution during undesirable porous film formation. However, CBD parameters that are typically used by researchers and industry produce $Cd^{2+}$ molarity that is below ISE detection limits (<10-7 M).

CBD parameters for proper measurement of $Cd^{2+}$ concentration are developed as well as a control technique that allows dense CdS thin film deposition while suppressing homogeneous CdS precipitation. Typical CBD parameters involve very high pH values and high concentration of ammonia, which are known to react with most of the $Cd^{2+}$ ions available in solution. If the pH is decreased and ammonia concentration reduced, $Cd^{2+}$ molarity is increased and measurable by ISE. Since Kitaev et al. assumed that cadmium sulfide only deposits under high pH, decreasing pH is not often attempted, but it has been proven that this assumption is not true because cadmium sulfide films can be produced by CBD method even in acidic solutions. The present invention provides parameters set so that the solution is slightly basic and buffered to allow $Cd^{2+}$ monitoring using ISE. The control technique implemented is simply the reduction of the pH of the solution to neutral pH when $Cd^{2+}$ decrement is detected, which stops the reaction that forms homogenous precipitate or porous films. Another contribution is reducing regents by more than 10 times from the amounts used in typical cadmium sulfide CBD. Finally, it is important to emphasize that this work presents, for the first time, real time monitoring of $Cd^{2+}$ molarity during cadmium sulfide CBD with a commercially available ISE probe.

Seven glass slides are placed in the reactor after being properly cleaned. First, the glass slides are cleaned ultrasonically in a detergent solution made of 0.3 g of ALCONOX® powder solution and 240 mL of 18 Ω-cm water for 30 minutes at 40° C., and they are thoroughly rinsed under a stream of 18 MΩ-cm water for 5 minutes. Second, the slides are cleaned ultrasonically using isopropyl alcohol for 10 minutes and again thoroughly rinsed under a stream of 18 MΩ-cm water for 5 minutes. A solution with 1:1:7 ratios of ammonia, hydrogen peroxide, and water is used to clean and prepare the surface for cadmium sulfide CBD. The slides are placed in this solution and kept at 70° C. for 30 minutes. Then, they are transferred to a storing solution of ammonia with pH=9 at room temperature and left there overnight in order to saturate the surface with negative charges, which are critical for nucleation sites and formation of uniform films [23] [24]. Before the samples are transferred to the reactor, the ammonia storage solution is boiled along with the samples for 10 minutes in order to remove ammonia and other gasses. Once the boiled solution has cooled down to about 70° C., the samples are finally transferred inside the reactor.

The solution parameters that made possible the real-time monitoring of cadmium free ion are shown in the last column of Table 1. The parameters are compared to typical parameters and those developed by Chu et al.

TABLE 1

Parameters for CBD cadmium ion monitoring.

|  | Typical Parameters | Chu et al. Parameters | This Work: Parameters for CBD Cadmium Ion Monitoring |
| --- | --- | --- | --- |
| Cadmium Salt | 20 mM to 0.1M | 1 mM Cadmium Acetate | 1 mM Cadmium Acetate |
| Thiourea | At least twice the molarity of Cd-Salt | 5 mM | 5 mM |
| Temperature | 50° C. to 90° C. | 85° C. | 60° C. (ISE Limit) |
| pH | At least 11.0 | 9.1 | 8.9 |
| Ammonia | At least 1M | 0.4M | 0.05M |
| Buffering Salt | None | 20 mM Ammonium Acetate | 10 mM Ammonium Acetate |

After adding 10 mM of ammonium acetate and 1 mM of cadmium acetate, the pH is adjusted to 8.4 from $t=t_2$ to $t=t_3$. Cadmium ion molarity is reduced by complexation to 200 μM having 80% of the cadmium molarity in cadmium-ammonium complexes. The free cadmium ion concentration is shown in FIG. 1

Cadmium ion Decomplexation Analysis: $t=t_2$ to $t=t_3$. The decomplexation rate is calculated to 1.5 μM/min. This is still larger than the decomplexation rate of 1.0 μM/min at pH=8.9, but this decomplexation rate is 46% smaller than the decomplexation of 2.8 μM/min at pH=8.2. Therefore, the increasing pH from 8.2 to 8.4 does significantly improved the rate of cadmium decomplexation. After measuring the decomplexation rate, a small dose of ammonia is added to keep cadmium ion molarity and pH constant before the addition of the Thiourea.

Thiourea Titration: $t=t_3$ to $t=t_a$. Thiourea is added slowly at a titration rate of 0.25 mM/min during 10 minutes. While Thiourea molarity is increased from 0 to 1.4 mM, cadmium-thiourea complexes are formed decreasing cadmium ion molarity by about 80%. While increasing the molarity of Thiourea from 1.4 mM to 2.5 mM, cadmium ion molarity stays relatively constant meaning that between 1.4 mM to 2.5 mM Thiourea maximizes it's complexation capabilities.

Second Thiourea and Cadmium Complexation Phase: $t=t_4$ to $t=t_5$. During this time, no changes in the solution are observed. In cadmium sulfide CBD, cadmium sulfide film deposition is always visible before homogenous precipitation, but no film deposition is visible. Thus, this decrement in cadmium ion molarity is simply a mystery because it does not relate to cadmium sulfide film deposition or homogenous precipitation. It could be due to a second phase of cadmium ion complexation with thiourea. At $t=t_5$, cadmium ion molarity decrement finally stops.

Cadmium Sulfide Deposition: $t=t_4$ to $t=t_5$. One minute after $t=t_5$, cadmium sulfide film deposition is observable. The yellow cadmium sulfide film coats all the surfaces of the reactor without any homogenous precipitation. At t=78, the first glass slide is removed of the reaction. This slide is covered uniformly with an extremely thin, reflective, and transparent yellow film of cadmium sulfide. In fact, it is as reflective as glass. The film is assumed very thin because it is extremely transparent. It can only be seen with a white background and compared to a new glass slide. After removing it from the reaction, the slide is rinsed under a stream of 18 MΩ-cm water and dried with nitrogen. The other six samples are also removed after 27 minutes. It is observed that with the longer deposition the films become a little darker yellow due to thickness increment. All the samples have uniform and transparent films with a very reflective and smooth surface. After the removal of the first slide, the cadmium ion molarity starts to decrease.

Figure 2:
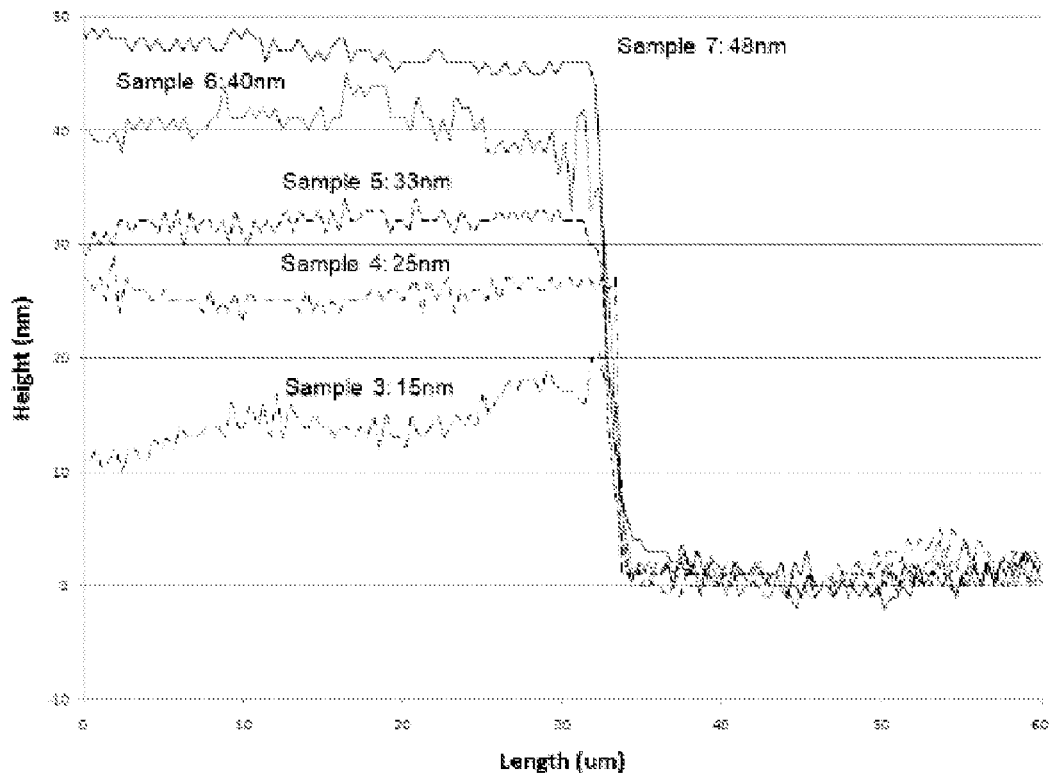
FIG. 2 is a plot of the surface profiler thickness results for samples.

Seven samples were prepared and their thickness measured using an Alpha-Step surface profiler manufactured by KLA-Tencor Corporation as shown in FIG. 2. This instrument uses a stylus that scans the surfaces by physical contact. Ideally, it can measure step heights down to 1 nm and up to 2 mm.

Figure 3:
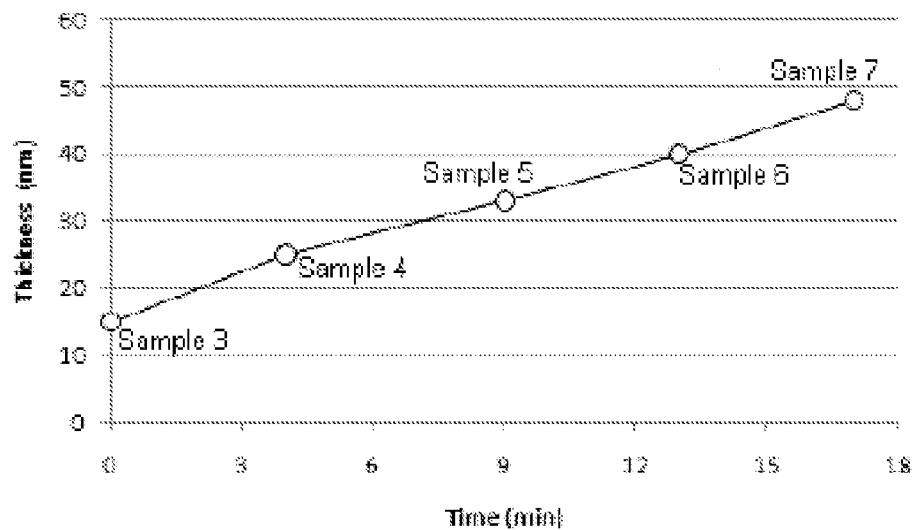
FIG. 3 is a plot of the deposition rate in cadmium sulfide.

The results of all scans of samples: 7, 6, 5, 4, and 3 are presented and summarized in FIG. 3. These results are obtained after averaging 10 measurements of each sample in order to reduce the noise influence. The raw data in mm by mm is used in MS Excel to place the step location of all samples at the same point, and illustrates the difference in thickness. Although the instrument has a vertical resolution of 1 nm, it was not possible to measure the step height for sample numbers 1 and 2. Thus, the thickness of these samples is estimated to be below 10 nm. From FIG. 3, the deposition rate in cadmium sulfide CBD is approximately 2 nm/min.

Figure 4:
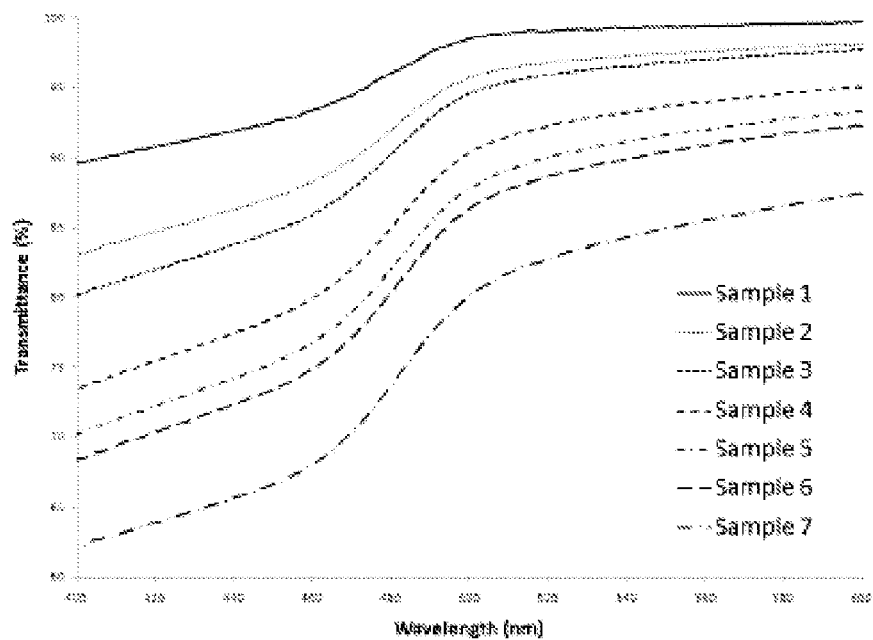
FIG. 4 is a plot of the transmittance data of the CdS films.
Figure 5:
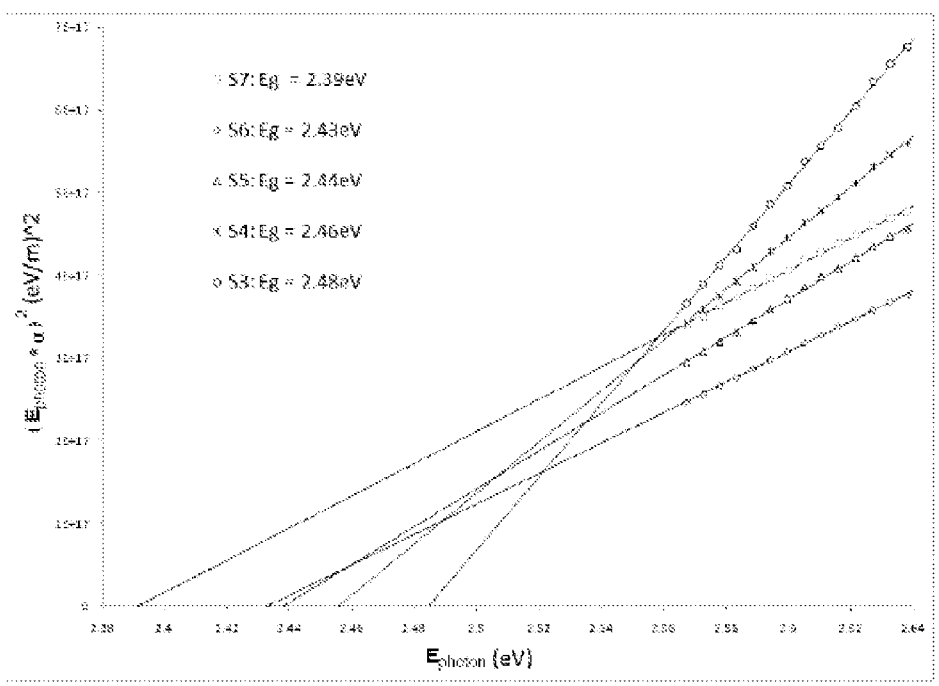
FIG. 5 is an extrapolation plot of photons.

Ideally, cadmium sulfide is a semiconductor transparent to light energies below 2.42 eV or light wavelengths above 512 nm. Therefore, analyzing transmittance from 400 nm to 600 nm can be used to find the actual band gap of the cadmium sulfide samples produced in this work. Cadmium sulfide films are deposited on top of a glass substrate that is almost transparent to light in the 400 nm to 600 nm range. Since some light is absolved by the substrate, a double beam spectrophotometer can be used to isolate the transmittance of the cadmium sulfide films using glass in the reference beam of the instrument. In this work, a Cary 5000 double beam spectrophotometer manufactured by Varian Inc., is used to measure the isolated transmittance of the cadmium sulfide films. Transmittance data of the CdS films are shown in FIG. 4. Using this data, the band gaps of the films are given in Table 2 below and in very good agreement with the 2.42 eV band gap of single crystal cadmium sulfide.

TABLE 2

Band Gap Results by Least-Square Approx. from $E_{photo} = 2.57$ eV to $E_{photo} = 2.64$ eV

|  | Sample 7 | Sample 6 | Sample 5 | Sample 4 | Sample 3 |
| --- | --- | --- | --- | --- | --- |
| $C^2$ (eV$^4$/m$^2$) | 1.948E+18 | 1.842E+18 | 2.290E+18 | 3.084E+18 | 4.425E+18 |
| $-C^2 * E_g$ (eV$^2$/m$^2$) | −4.658E+18 | −4.480E+18 | −5.582E+18 | −7.574E+18 | −1.099E+19 |
| $E_g$ (eV) | 2.391 | 2.433 | 2.438 | 2.456 | 2.485 |

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, MB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit, and scope of the invention. All such similar substitutes and modifications apparent to those skilled in the art are deemed to be within the spirit, scope, and concept of the invention as defined by the appended claims.

What is claimed is:

1. A method for forming a metal layer on a solar cell substrate comprising the steps of:
   providing a reaction chamber comprising an anion-selective electrode in communication with a solution comprising an ammonium ion, a metal ion, and a buffer;
   adjusting the pH of the solution to a slightly basic pH;
   monitoring a metal ion concentration in the solution with the anion-selective electrode;
   forming a metal-ammonium complex in the reaction chamber from the ammonium ion and the metal ion;
   decomplexing the metal-ammonium complex to form a decomplexed metal ion;
   detecting a decrease in the metal ions concentration and reducing the pH to a neutral pH;
   titrating the decomplexed metal ion with a thiourea composition to form a metal-thiourea complex;
   forming a metal sulfide composition from the metal-thiourea complex; and
   depositing the metal sulfide composition on a solar cell substrate in the reaction chamber to form a metal sulfide layer.

2. The method of claim 1, wherein the metal ion is selected from a group consisting of silver, nickel, zinc, cadmium, tin, copper, or combinations or mixtures thereof.

3. A method of forming a metal sulfide layer comprising the steps of:
   providing a reaction chamber with an anion-selective electrode in communication with a solution comprising an ammonium ion, a metal ion, and a buffer;
   adjusting the pH of the solution to between 8.5-9.5;
   providing a substrate in communication with the reaction chamber and the solution;
   monitoring a metal ion concentration in the solution with the anion-selective electrode;

forming a metal-ammonium complex in the reaction chamber;

decomplexing the metal-ammonium complex to form a decomplexed metal ion;

titrating the solution with a thiourea composition to form a metal-thiourea complex,. wherein the thiourea composition is added at between 0.1 and 0.5 mM/min;

forming a metal sulfide composition from the metal-thiourea complex; and depositing the metal sulfide composition on a solar cell substrate in the reaction chamber to form a metal sulfide layer.

4. The method of claim 3, wherein the metal ion is selected from a group consisting of silver, nickel, zinc, cadmium, tin, copper or combinations or mixtures thereof.

5. A method of identify cadmium sulfide film heterogeneous growth and cadmium sulfide powder homogenous precipitate comprising the steps of:

providing a reaction chamber comprising an anion-selective electrode in communication with a solution comprising an ammonium ion, a cadmium ion, and a buffer;

providing a substrate in communication with the reaction chamber and the solution;

monitoring the cadmium ion in the solution with the anion-selective electrode;

forming a cadmium-ammonium complex in the reaction chamber;

decomplexing the cadmium-ammonium complex to form a decomplexed cadmium ion;

titrating the decomplexed cadmium ion with a thiourea composition to form a cadmium-thiourea complex;

forming a cadmium sulfide composition from the cadmium-thiourea complex;

depositing a cadmium sulfide layer on the substrate in the reaction chamber; and identifying a heterogeneous cadmium sulfide film growth or a homogeneous cadmium sulfide powder precipitate.

6. A method of monitoring cadmium sulfide layer deposition on a substrate comprising the steps of:

providing a reaction chamber comprising at least one anion-selective electrode in communication with a solution comprising an ammonium ion, a cadmium ion, and a buffer at a basic pH;

providing a substrate in communication with the reaction chamber and the solution;

monitoring the cadmium ion in the solution with an anion-selective electrode;

forming a cadmium-ammonium complex in the reaction chamber;

decomplexing the cadmium-ammonium complex;

titrating with a thiourea composition to form a cadmium-thiourea complex, wherrin the thiourea composition has a molarity of between 1.0 and 3.0 mM;

observing the cadmium ion concentration with an anion-selective electrode;

forming a cadmium sulfide composition from the cadmium-thiourea complex; and depositing a cadmium sulfide layer on a solar cell substrate in the reaction chamber.

7. A method of fabricating a semiconductor composition comprising the steps of:

providing a reaction chamber comprising an anion-selective electrode in communication with a solution comprising an ammonium ion, a metal ion, and a buffer;

adjusting the pH to a slightly basic pH;

providing a semiconductor substrate in communication with the reaction chamber and the solution;

monitoring the metal ion concentration in the solution with an anion-selective electrode;

forming combining the metal ion and the ammonium ion to form a metal-ammonium complex in the reaction chamber;

decomplexing the metal-ammonium complex;

titrating with a thiourea composition to form a metal-thiourea complex;

forming a metal sulfide composition from the metal-thiourea complex; and depositing a metal sulfide layer on a solar cell substrate in the reaction chamber.

8. The method of claim 7, wherein the metal ion is selected from a group consisting of silver, nickel, zinc, cadmium, tin, copper or combinations or mixtures thereof.

9. A method for forming a metal layer on a solar cell substrate comprising the steps of:

providing a reaction chamber comprising an anion-selective electrode in communication with a solution comprising an ammonium ion, a metal ion selected from a silver, nickel, zinc, cadmium, tin, copper or combinations or mixtures thereof, and a buffer, adjusting the pH of the solution to between 8-10;

monitoring a metal ion concentration in the solution with the anion-selective electrode;

forming a metal-ammonium complex in the reaction chamber;

decomplexing the metal-ammonium complex to form a decomplexed metal ion;

detecting a decrease in the metal ions concentration and reducing the pH to a neutral pH;

titrating the decomplexed metal ion with a thiourea composition to form a metal-thiourea complex;

forming a metal sulfide composition from the metal-thiourea complex; and depositing a metal sulfide layer on a solar cell substrate in the reaction chamber.

10. The method of claim 1, wherein the pH is between 7.2-10.0.

11. The method of claim 1, wherein the pH is between 8.2-9.1.

12. The method of claim 1, wherein the ammonia is between 0.01 and 0.2 M.

13. The method of claim 1, wherein the titration rate is between 0.1 and 0.5 mM/min.

14. The method of claim 1, wherein the thiourea composition has a molarity of between 1.0 and 3.0 mM.

15. The method of claim 1, wherein the pH is about 9, the ammonia concentration is about 0.05M and the titration rate is about 0.25 mM/min.

* * * * *

UNITED STATES PATENT AND TRADEMARK OFFICE
CERTIFICATE OF CORRECTION

Page 1 of 1

PATENT NO. : 8,518,737 B2
APPLICATION NO. : 13/222710
DATED : August 27, 2013
INVENTOR(S) : David Zubia et al.

It is certified that error appears in the above-identified patent and that said Letters Patent is hereby corrected as shown below:

In The Specification

Column 1, line 25, please delete "None" and insert therefore -- This invention was made with government support under DE-EE0005958 awarded by the Department of Energy. The government has certain rights in the invention. --

Signed and Sealed this
Twenty-ninth Day of March, 2016

Michelle K. Lee
*Director of the United States Patent and Trademark Office*